(12) United States Patent
Milicevic et al.

(10) Patent No.: US 9,067,816 B2
(45) Date of Patent: Jun. 30, 2015

(54) PCVD METHOD AND APPARATUS

(71) Applicant: Draka Comteq, B.V., Amsterdam (NL)

(72) Inventors: Igor Milicevic, Helmond (NL);
Mattheus Jacobus Nicolaas van Stralen, Tilburg (NL); Johannes Antoon Hartsuiker, Eindhoven (NL)

(73) Assignee: Draka Comteq, B.V., Amsterdam (NL)

(*) Notice: Subject to any disclaimer, the term of this patent is extended or adjusted under 35 U.S.C. 154(b) by 217 days.

(21) Appl. No.: 13/683,555

(22) Filed: Nov. 21, 2012

(65) Prior Publication Data

US 2013/0167593 A1    Jul. 4, 2013

(30) Foreign Application Priority Data

Nov. 21, 2011    (NL) ...................................... 2007831

(51) Int. Cl.
| C03B 19/14 | (2006.01) |
| C03B 37/014 | (2006.01) |
| C03B 37/018 | (2006.01) |
| C23C 16/04 | (2006.01) |
| C23C 16/455 | (2006.01) |
| C23C 16/511 | (2006.01) |

(52) U.S. Cl.
CPC ......... C03B 37/01413 (2013.01); C03B 19/143 (2013.01); C03B 37/0183 (2013.01); C23C 16/045 (2013.01); C23C 16/45523 (2013.01); C23C 16/511 (2013.01)

(58) Field of Classification Search
CPC .............................. C03B 19/14; C03B 19/143
USPC .................................................. 65/379, 417
See application file for complete search history.

(56) References Cited

U.S. PATENT DOCUMENTS

| 4,314,833 | A | | 2/1982 | Kuppers |
| 4,714,589 | A | * | 12/1987 | Auwerda et al. ............... 427/573 |
| 4,741,747 | A | | 5/1988 | Geittner et al. |
| 4,838,643 | A | | 6/1989 | Hodges et al. |
| 4,857,091 | A | | 8/1989 | Geittner et al. |
| 4,944,244 | A | * | 7/1990 | Moisan et al. ......... 118/723 MW |
| 5,574,816 | A | | 11/1996 | Yang et al. |
| 5,717,805 | A | | 2/1998 | Stulpin |
| 5,761,362 | A | | 6/1998 | Yang et al. |
| 5,911,023 | A | | 6/1999 | Risch et al. |
| 5,982,968 | A | | 11/1999 | Stulpin |
| 6,035,087 | A | | 3/2000 | Bonicel et al. |
| 6,066,397 | A | | 5/2000 | Risch et al. |
| 6,085,009 | A | | 7/2000 | Risch et al. |
| 6,134,363 | A | | 10/2000 | Hinson et al. |
| 6,175,677 | B1 | | 1/2001 | Yang et al. |
| 6,181,857 | B1 | | 1/2001 | Emeterio et al. |
| 6,210,802 | B1 | | 4/2001 | Risch et al. |
| 6,215,931 | B1 | | 4/2001 | Risch et al. |
| 6,260,510 | B1 | | 7/2001 | Breuls et al. |
| 6,314,224 | B1 | | 11/2001 | Stevens et al. |
| 6,321,012 | B1 | | 11/2001 | Shen |
| 6,321,014 | B1 | | 11/2001 | Overton et al. |
| 6,334,016 | B1 | | 12/2001 | Greer, IV |
| 6,372,305 | B2 | | 4/2002 | Breuls et al. |
| 6,381,390 | B1 | | 4/2002 | Hutton et al. |
| 6,493,491 | B1 | | 12/2002 | Shen et al. |
| 6,603,908 | B2 | | 8/2003 | Dallas et al. |
| 6,618,538 | B2 | | 9/2003 | Nechitailo et al. |
| 6,658,184 | B2 | | 12/2003 | Bourget et al. |
| 6,749,446 | B2 | | 6/2004 | Nechitailo |
| 6,901,775 | B2 | * | 6/2005 | de Sandro et al. ............... 65/530 |
| 6,912,347 | B2 | | 6/2005 | Rossi et al. |
| 6,922,515 | B2 | | 7/2005 | Nechitailo et al. |
| 6,928,839 | B2 | * | 8/2005 | Blinov ........................... 65/391 |
| 6,941,049 | B2 | | 9/2005 | Risch et al. |
| 7,045,010 | B2 | | 5/2006 | Sturman, Jr. |
| 7,162,128 | B2 | | 1/2007 | Lovie et al. |
| 7,322,122 | B2 | | 1/2008 | Overton et al. |
| 7,346,244 | B2 | | 3/2008 | Gowan et al. |
| 7,356,234 | B2 | | 4/2008 | de Montmorillon et al. |
| 7,483,613 | B2 | | 1/2009 | Bigot-Astruc et al. |
| 7,515,795 | B2 | | 4/2009 | Overton et al. |
| 7,526,177 | B2 | | 4/2009 | Matthijsse et al. |
| 7,555,186 | B2 | | 6/2009 | Flammer et al. |
| 7,567,739 | B2 | | 7/2009 | Overton et al. |
| 7,570,852 | B2 | | 8/2009 | Nothofer et al. |
| 7,587,111 | B2 | | 9/2009 | de Montmorillon et al. |
| 7,599,589 | B2 | | 10/2009 | Overton et al. |
| 7,623,747 | B2 | | 11/2009 | de Montmorillon et al. |

(Continued)

FOREIGN PATENT DOCUMENTS

| EP | 0064785 A1 | 11/1982 |
| EP | 1550640 A1 | 7/2005 |

(Continued)

OTHER PUBLICATIONS

European Search Report in counterpart European Application Serial No. 12192965.7 dated Mar. 27, 2013, pp. 1-6.

Dutch Search Report and Written Opinion in counterpart NL Application Serial No. 2007831 dated May 7, 2012, pp. 1-5.

Office Action in counterpart European Application Serial No. 12192965.7 dated Jan. 6, 2014, pp. 1-5.

Intention to Grant in counterpart European Application Serial No. 12192965.7 dated May 23, 2014, pp. 1-6.

(Continued)

*Primary Examiner* — Cynthia Szewczyk

(74) *Attorney, Agent, or Firm* — Additon, Higgins & Pendleton, P.A.

(57) ABSTRACT

The disclosed Plasma Chemical Vapor Deposition (PCVD) process uses the injection of plasma-reactive gas to control deposition oscillation and refractive-index oscillation (e.g., alpha oscillation). This PCVD process, which may employ a modified PCVD apparatus, achieves more uniform glass deposition. This, in turn, results in optical preforms and optical fibers having more uniform optical properties.

15 Claims, 3 Drawing Sheets

(56) References Cited

U.S. PATENT DOCUMENTS

| | | |
|---|---|---|
| 7,639,915 B2 | 12/2009 | Parris et al. |
| 7,646,952 B2 | 1/2010 | Parris |
| 7,646,954 B2 | 1/2010 | Tatat |
| 7,702,204 B2 | 4/2010 | Gonnet et al. |
| 7,724,998 B2 | 5/2010 | Parris et al. |
| 7,817,891 B2 | 10/2010 | Lavenne et al. |
| 7,854,149 B2 * | 12/2010 | Fuflyigin ................... 65/417 |
| 7,889,960 B2 | 2/2011 | de Montmorillon et al. |
| 7,970,247 B2 | 6/2011 | Barker |
| 7,974,507 B2 | 7/2011 | Lovie et al. |
| 7,981,485 B2 | 7/2011 | Van Stralen et al. |
| 7,995,888 B2 | 8/2011 | Gholami et al. |
| 8,009,950 B2 | 8/2011 | Molin et al. |
| 8,031,997 B2 | 10/2011 | Overton |
| 8,041,167 B2 | 10/2011 | Overton |
| 8,041,168 B2 | 10/2011 | Overton |
| 8,041,172 B2 | 10/2011 | Sillard et al. |
| 8,055,111 B2 | 11/2011 | Sillard et al. |
| 8,081,853 B2 | 12/2011 | Overton |
| 8,145,025 B2 | 3/2012 | de Montmorillon et al. |
| 8,145,026 B2 | 3/2012 | Overton et al. |
| 8,165,439 B2 | 4/2012 | Overton |
| 8,195,018 B2 | 6/2012 | Overton et al. |
| 8,259,389 B2 | 9/2012 | Pastouret et al. |
| 8,265,442 B2 | 9/2012 | Overton |
| 8,274,647 B2 | 9/2012 | Gholami et al. |
| 8,280,213 B2 | 10/2012 | Molin et al. |
| 8,290,324 B2 | 10/2012 | Sillard et al. |
| 8,301,000 B2 | 10/2012 | Sillard et al. |
| 8,306,380 B2 | 11/2012 | Leatherman et al. |
| 8,314,408 B2 | 11/2012 | Hartsuiker et al. |
| 8,340,488 B2 | 12/2012 | Molin et al. |
| 8,346,040 B2 | 1/2013 | Testu et al. |
| 8,391,661 B2 | 3/2013 | Molin et al. |
| 8,401,353 B2 | 3/2013 | Barker et al. |
| 8,406,593 B2 | 3/2013 | Molin et al. |
| 2005/0172902 A1 | 8/2005 | Van Stralen et al. |
| 2008/0292262 A1 | 11/2008 | Overton et al. |
| 2009/0214167 A1 | 8/2009 | Lookadoo et al. |
| 2009/0297107 A1 | 12/2009 | Tatat |
| 2010/0021170 A1 | 1/2010 | Lumineau et al. |
| 2010/0119202 A1 | 5/2010 | Overton |
| 2010/0135627 A1 | 6/2010 | Pastouret et al. |
| 2010/0142033 A1 | 6/2010 | Regnier et al. |
| 2010/0142969 A1 | 6/2010 | Gholami et al. |
| 2010/0154479 A1 * | 6/2010 | Milicevic et al. ................ 65/391 |
| 2010/0166375 A1 | 7/2010 | Parris |
| 2010/0189397 A1 | 7/2010 | Richard et al. |
| 2010/0202741 A1 | 8/2010 | Ryan et al. |
| 2010/0214649 A1 | 8/2010 | Burov et al. |
| 2010/0215328 A1 | 8/2010 | Tatat et al. |
| 2010/0310218 A1 | 12/2010 | Molin et al. |
| 2011/0026889 A1 | 2/2011 | Risch et al. |
| 2011/0058781 A1 | 3/2011 | Molin et al. |
| 2011/0069724 A1 | 3/2011 | Richard et al. |
| 2011/0069932 A1 | 3/2011 | Overton et al. |
| 2011/0091171 A1 | 4/2011 | Tatat et al. |
| 2011/0116160 A1 | 5/2011 | Boivin et al. |
| 2011/0123161 A1 | 5/2011 | Molin et al. |
| 2011/0123162 A1 | 5/2011 | Molin et al. |
| 2011/0135263 A1 | 6/2011 | Molin et al. |
| 2011/0176782 A1 | 7/2011 | Parris |
| 2011/0188823 A1 | 8/2011 | Sillard et al. |
| 2011/0188826 A1 | 8/2011 | Sillard et al. |
| 2011/0217012 A1 | 9/2011 | Bigot-Astruc et al. |
| 2011/0229101 A1 | 9/2011 | de Montmorillon et al. |
| 2011/0247369 A1 * | 10/2011 | Milicevic et al. ................ 65/391 |
| 2011/0268398 A1 | 11/2011 | Quinn et al. |
| 2011/0268400 A1 | 11/2011 | Lovie et al. |
| 2011/0287195 A1 | 11/2011 | Molin |
| 2012/0009358 A1 | 1/2012 | Gharbi et al. |
| 2012/0014652 A1 | 1/2012 | Parris |
| 2012/0040105 A1 | 2/2012 | Overton |
| 2012/0040184 A1 | 2/2012 | de Montmorillon et al. |
| 2012/0051703 A1 | 3/2012 | Bigot-Astruc et al. |
| 2012/0057833 A1 | 3/2012 | Tatat |
| 2012/0092651 A1 | 4/2012 | Molin et al. |
| 2012/0134376 A1 | 5/2012 | Burov et al. |
| 2012/0148206 A1 | 6/2012 | Boivin et al. |
| 2012/0195549 A1 | 8/2012 | Molin et al. |
| 2012/0213483 A1 | 8/2012 | Risch et al. |
| 2012/0224254 A1 | 9/2012 | Burov et al. |
| 2012/0243843 A1 | 9/2012 | Molin et al. |
| 2012/0251062 A1 | 10/2012 | Molin et al. |
| 2012/0275751 A1 | 11/2012 | Krabshuis et al. |
| 2012/0301093 A1 | 11/2012 | Sillard et al. |
| 2012/0315006 A1 | 12/2012 | Bigot-Astruc et al. |
| 2013/0004135 A1 | 1/2013 | Bigot-Astruc et al. |
| 2013/0028564 A1 | 1/2013 | Molin et al. |
| 2013/0167593 A1 | 7/2013 | Milicevic et al. |

FOREIGN PATENT DOCUMENTS

| | | |
|---|---|---|
| EP | 1921478 A1 | 5/2008 |
| EP | 1923360 A1 | 5/2008 |
| EP | 2199263 A1 | 6/2010 |
| EP | 2594659 A1 | 5/2013 |
| GB | 2068359 A | 8/1981 |
| WO | 99/35304 A1 | 7/1999 |
| WO | 2004/101458 A1 | 11/2004 |
| WO | 2009/062131 A1 | 5/2009 |

OTHER PUBLICATIONS

Gloge et al., "Multimode Theory of Graded-Core Fibers," Bell system Technical Journal 1973, pp. 1563-1578.

Yabre, "Comprehensive Theory of Dispersion in Graded-Index Optical Fibers," Journal of Lightwave Technology, Feb. 2000, vol. 18, No. 2, pp. 166-177.

European Search Report in counterpart European Application Serial No. 14184932 dated Oct. 15, 2014, pp. 1-6.

* cited by examiner

PCVD METHOD AND APPARATUS

CROSS-REFERENCE TO PRIORITY APPLICATION

This application hereby claims the benefit of pending Dutch Application No. 2007831 (filed Nov. 21, 2011, at the Dutch Patent Office), which is hereby incorporated by reference in its entirety.

FIELD OF THE INVENTION

The present invention relates to the field of Plasma Chemical Vapor Deposition (PCVD).

BACKGROUND

Plasma-enhanced chemical vapor deposition (PECVD or PCVD) is a process used to deposit thin films from a gaseous state (vapor) to a solid state. In the PCVD process, chemical reactions occur after creation of a plasma of the reacting gases.

Generally, in the field of optical fibers, multiple thin films of glass (e.g., glass layers) are deposited on the inside surface of a substrate tube. Glass-forming gases (e.g., doped or undoped reactive gases) are introduced into the interior of the substrate tube from one end (i.e., the supply side of the substrate tube). Doped or undoped glass layers are deposited onto the interior surface of the substrate tube. The gases are discharged or removed from the other end of the substrate tube (i.e., the discharge side of the substrate tube), optionally by the use of a vacuum pump. A vacuum pump has the effect of generating a reduced pressure within the interior of the substrate tube, such as a pressure of between 5 and 50 mbar.

Generally, microwaves from a microwave generator are directed toward an applicator via a waveguide. The applicator, which surrounds a glass substrate tube, couples the high-frequency energy into the plasma. In addition, the applicator and the substrate tube are generally surrounded by a furnace so as to maintain the substrate tube at a temperature of 900-1300° C. during the deposition process. The applicator (and hence the plasma it forms) is moved reciprocally in the substrate tube's longitudinal direction. A thin glass layer is deposited onto the interior surface of the substrate tube with every stroke or pass of the applicator.

Thus, the applicator is moved in translation over the length of the substrate tube within the boundaries of a surrounding furnace. With this translational movement of the applicator, the plasma also moves in the same direction. As the applicator reaches the furnace's inner wall near one end of the substrate tube, the movement of the applicator is reversed so that it moves to the other end of the substrate tube toward the furnace's other inner wall. The applicator and thus the plasma travel in a back-and-forth movement along the length of the substrate tube. Each reciprocating movement is called a "pass" or a "stroke." With each pass, a thin layer of glass is deposited on the substrate tube's inside surface.

Normally, a plasma is generated only in a part of the substrate tube (e.g., the part that is surrounded by the microwave applicator). Typically, the dimensions of the microwave applicator are smaller than the respective dimensions of the furnace and the substrate tube. The reactive gases are converted into solid glass and deposited on the substrate tube's inside surface only at the position of the plasma.

The passes increase the cumulative thickness of these thin films (i.e., the deposited material), which decreases the remaining internal diameter of the substrate tube. In other words, the hollow space inside the substrate tube gets progressively smaller with each pass.

One way of manufacturing an optical preform via a PCVD process is disclosed in commonly assigned U.S. Pat. No. 4,314,833, which is hereby incorporated by reference in its entirety. According to this process, one or more doped or undoped glass layers are deposited onto the interior of a glass substrate tube using low-pressure plasma within the glass substrate tube. After the glass layers have been deposited onto the interior surface of the glass substrate tube, the glass substrate tube is subsequently contracted by heating into a solid rod (i.e., "collapsed"). In one embodiment, the solid rod may be externally provided with an additional amount of glass, such as via an external vapor deposition process or by using one or more preformed glass tubes, thereby obtaining a composite preform. One end of the resulting preform is heated, and optical fibers are obtained by drawing.

According to commonly assigned International Publication No. WO 99/35304 A1 and its counterpart U.S. Pat. Nos. 6,372,305 and 6,260,510, each of which is hereby incorporated by reference in its entirety, microwaves from a microwave generator are directed toward an applicator via a waveguide. The applicator, which surrounds a glass substrate tube, couples the high-frequency energy into the plasma.

Commonly assigned European Patent No. 1,550,640 and its counterpart U.S. Patent Publication No. 2005/0172902, each of which is hereby incorporated by reference in its entirety, disclose an apparatus for carrying out a PCVD process using choke having a specific length and width to minimize the losses of high-frequency energy during the entire deposition process, which reduces microwave leakage and leads to efficient energy consumption.

U.S. Pat. No. 4,741,747, which is hereby incorporated by reference in its entirety, relates to methods for reducing optical and geometrical end taper in the PCVD process. The regions of non-constant deposition geometry at the ends of the preform (taper) are reduced by moving the plasma in the area of at least one reversal point nonlinearly with time and/or by changing the longitudinal extent of the plasma as a function of time.

U.S. Pat. No. 4,857,091, which is hereby incorporated by reference in its entirety, relates to a PCVD method of making optical fibers whose refractive index profiles show specific peripheral and/or radial and/or axial optical modulation structures. Parameters are varied to influence (i) the uniformity of the material transport to the inner wall of the tube and/or the deposition yields of the glass over the tube circumference and/or (ii) the axial position of the local deposition zone with respect to the reactor producing the plasma.

United Kingdom Patent No. 2,068,359, which is hereby incorporated by reference in its entirety, relates to a PCVD process in which the plasma column is swept along the substrate tube by varying the power input to the device to effect direct formation of a glass layer along the swept and heated region of the tube.

Commonly assigned European Patent No. 2199263 and its counterpart U.S. Patent Publication No. 2010/0154479, each of which is hereby incorporated by reference in its entirety, disclose a PCVD process that can be used to minimize axial refractive index variations along a substrate tube by controlling the gas composition (primarily dopant composition) in the substrate tube as a function of the applicator (plasma zone) position.

U.S. Pat. No. 6,901,775, which is hereby incorporated by reference in its entirety, discloses an apparatus for internally coating a substrate tube via a PCVD process. The gas delivery unit includes an insert, which is inserted to prevent a disturbance in the gas flow that could induce a standing wave of a certain period and amplitude in the gas flow. According to this patent, the standing wave is, in turn, responsible for a non-uniform deposition within the interior of the substrate tube.

Commonly assigned European Patent No. 1,923,360 and its counterpart U.S. Pat. No. 7,981,485, each of which is hereby incorporated by reference in its entirety, disclose a PCVD process that provides uniform thickness and refractive index deposition in a substrate tube's axial direction. In this method, the furnace is moved reciprocally (e.g., 15, 30, or 60 millimeters) along a substrate tube's axial direction. The movement of the furnace is used to reduce the effect of what is believed to be non-uniform distribution of microwave power along the substrate tube's axial direction, which might be caused by microwave-applicator, position-dependent reflections of some of the microwave power (e.g., from the inner wall of the surrounding furnace). Such non-uniformity in axial microwave power can cause non-uniformity in axial deposition thickness and refractive index, which adversely affects optical-fiber quality parameters, such as attenuation, mode field width uniformity, and bandwidth uniformity.

Commonly assigned U.S. Patent Publication No. 2011/0247369, which is hereby incorporated by reference in its entirety, discloses a PCVD process in which the reaction zone moves back and forth in the longitudinal direction over a hollow glass substrate tube. An additional amount of a gas that includes a fluorine-containing compound is supplied to the interior of the hollow glass substrate tube when the reaction zone is located at or near the reversal point in order to reduce the incorporation of hydroxyl groups during the internal deposition process.

The foregoing notwithstanding, there is a need for an improved PCVD process that achieves more uniform glass deposition.

SUMMARY

As will be understood by those having ordinary skill in the art, during a Plasma Chemical Vapor Deposition (PCVD) process, glass deposition within the substrate tube occurs only where a plasma is present. The present inventors have observed that the plasma's frontline position (i.e., the frontal position upstream from the flow direction of glass-forming gases) may substantially vary relative to the applicator's position. This variation is generally a non-monotonously increasing or decreasing function of the applicator's position. The deposited glass will show a similar behavior, referred to herein as "deposition oscillation." Deposition oscillation may thus be described by a variation in the thickness or composition of the deposited glass over the length of the substrate tube.

In one applicator pass, the deposited glass layer (i.e., deposited thin glass film) will not have a uniform thickness. Where the cumulative duration of plasma presence is higher with respect to the substrate tube, a larger or thicker layer of glass is formed on the substrate tube. This effect has been observed to be self-reinforcing. In a subsequent applicator pass, the "thick spots" will generate more heat because of the deposited glass's poor heat conductivity. This, in turn, leads to even more glass deposition in the subsequent glass layers, which exacerbates the effect of the deposition oscillation.

In one aspect, the present invention achieves a glass substrate tube having vapor-deposited glass layers of essentially uniform thickness and essentially uniform refractive index (e.g., alpha value) in the lengthwise, axial direction. The glass substrate tube may be contracted into a solid glass rod, and the solid glass rod may be processed into an optical fiber.

In another aspect, the present invention embraces a method for carrying out a PCVD process. The PCVD method includes the following steps: (i) providing a glass substrate tube; (ii) supplying one or more glass-forming gases to the substrate tube; (iii) inducing a plasma via microwave radiation (at wavelength $\lambda$) on at least a portion of the substrate tube to induce deposition of one or more glass layers onto the substrate tube's interior surface.

More particularly, during this PCVD process (e.g., step iii), at least one plasma-reactive gas is supplied to the substrate tube in one or more pulses as a function of the plasma's axial position along the length of the substrate tube. This selective injection of plasma-reactive gas during the PCVD process helps to control deposition oscillations and/or refractive-index oscillations, such as alpha oscillations.

In this regard and by way of example, a plasma-reactive gas is typically a non-glass-forming precursor gas that is capable of being ionized in a plasma. Suitable plasma-reactive gases include argon, helium, oxygen, and nitrogen. These particular plasma-reactive gases can be used alone or in various combinations with each other. In addition, these plasma-reactive gases may be combined (e.g., diluted) with other gases (e.g., Freon-$C_2F_6$), in which case these particular plasma-reactive gases typically constitute at least 50 mole percent (e.g., more than 75 mole percent, such as 90-97 mole percent) of the resulting, diluted plasma-reactive gas.

In one PCVD embodiment, multiple pulses of plasma-reactive gas are typically supplied at longitudinal intervals along the substrate tube's length (e.g., during one pass of the applicator). That is, the timing and placement of the pulses are selected to fall in longitudinal positions corresponding to deposition oscillations and/or refractive-index oscillations (e.g., an alpha oscillation). Typically, the plasma-reactive gas is supplied in length increments equaling one (or an uneven multiple of) half the wavelength of the microwaves of step ii (e.g., $\frac{1}{2}n\cdot\lambda$, where n is an uneven number).

In another PCVD embodiment, one single pulse of plasma-reactive gas is supplied (e.g., during one pass of the applicator). The timing and placement of the pulse is selected to fall in a longitudinal position corresponding to a deposition oscillation and/or an alpha oscillation. As noted, the deposition oscillation pertains to a variation in the thickness of the deposited glass over the length of the substrate tube. In a particular embodiment, one single pulse has a duration of between about 250 and 1000 milliseconds (e.g., between about 500 and 750 milliseconds).

In yet another embodiment of this PCVD process, the pulse(s) are provided in both the forward movement of the pass (e.g., the applicator going from the supply side to the discharge side) and on the backward movement of the pass (e.g., the applicator going from the discharge side to the supply side). For example, pulse(s) may be provided in the last 150 to 400 millimeters (e.g., 150 to 200 millimeters) of the substrate tube near its discharge side.

Where one pulse is provided, the length and position can be selected so that the effect is present on the last part of the forward movement and the first part of the backward movement (i.e., corresponding to the reversal of the applicator). The length and position of the pulse is typically selected to fall in a longitudinal position corresponding to the deposition oscillation and/or refractive-index oscillation. In other words, the pulse of plasma-reactive gas helps to control deposition oscillation and/or refractive-index oscillation at a longitudinal position along the substrate tube's length.

In yet another embodiment, where multiple pulses of plasma-reactive gas are provided, the pulses are supplied at intervals equaling one (or an uneven multiple of) half of the wavelength of the microwaves of step ii. For example, the microwave wavelength may be twelve (12) centimeters and the pulse interval is six (6) centimeters (e.g., the timing of consecutive gas pulses achieves a six-centimeter separation along the substrate tube's length).

In yet another embodiment, the duration of one of these multiple pulses is between about 1 millisecond and 100 milliseconds (e.g., between about 25 and 75 milliseconds, such as 30-40 milliseconds). By way of illustration, for a 50-millisecond pulse, alpha oscillation may be affected over a region along the substrate tube's length that is between about one centimeter and five centimeters (e.g., about three centimeters or so). Without being bound by any theory, the pulse has been observed to work over a distance of about three centimeters or so, because there seems to be a certain dispersion of the pulse width after the gas pulse enters the substrate tube.

In yet another embodiment, the duration of one of these multiple pulses might be as long as 1000 milliseconds (i.e., one second), such as where the applicator speed has been decreased, such as by a factor of ten (10×) (e.g., from 30 cm/sec to about 3 cm/sec).

In this regard, the pulse duration may be modified by those having ordinary skill in the art to modulate the deposition oscillation and/or the alpha oscillation (i.e., the gas pulse may be lengthened or shortened as is appropriate to improve the resulting alpha profile of the deposited glass). More generally, the pulsing of the plasma reactive gas can address deposition oscillation and/or refractive-index oscillation using pulsing schemes in which the plasma reactive gas is being supplied to the substrate tube between one percent and 99 percent of the time (e.g., a duty cycle of about 25-75 percent, such as 50 percent "on" and 50 percent "off").

The plasma-reactive gas must travel through the substrate tube (e.g., about 10 m/sec), so there is thus a kind of a lag phase between the injection of the gas and the moment that the gas reaches the plasma. Those having ordinary skill in the art will be able to determine the lag phase and, if necessary, adjust the position and timing of the plasma-reactive gas, including the closing of the valve to stop the gas injection. Moreover, there will be a lag phase before the plasma-reactive gas is no longer present at the plasma's axial position along the substrate tube's length.

In yet another embodiment, the pressure of the plasma-reactive gas is between 0.5 bar and 5 bar, typically between 1 bar and 2 bar (e.g., about 1.5 bar).

In yet another aspect, the present invention embraces an apparatus for carrying out a PCVD process. The apparatus is configured to minimize any disturbance of the microwave energy from the applicator (e.g., a resonator) that could adversely affect the optical performance of the optical preform that is eventually produced.

As noted, one or more glass layers are deposited via a microwave induced plasma onto the interior surface of a glass substrate tube. As such, an exemplary PCVD apparatus includes a microwave applicator and a microwave guide for guiding microwaves and forming a plasma. The applicator is movable along the glass substrate tube between a point of reversal located at the substrate tube's supply side and a point of reversal located at the substrate tube's discharge side. The PCVD apparatus includes a gas injection device to provide the substrate tube's supply side with glass-forming gases and plasma-reactive gas. As noted, the apparatus is capable of supplying plasma-reactive gas in one or more pulses as a function of the axial position of the applicator along the substrate tube's length during the PCVD process.

In an exemplary embodiment, the gas injection device includes a valve (e.g., a fast valve that switches between an open position and closes position in 100 milliseconds or less) to control the flow of plasma-reactive gas. In another embodiment, said apparatus includes a controller (e.g., a microcontroller) to facilitate process control.

The foregoing illustrative summary, as well as other exemplary objectives and/or advantages of the invention, and the manner in which the same are accomplished, are further explained within the following detailed description and its accompanying drawings.

BRIEF DESCRIPTION OF THE DRAWINGS

FIG. 1 depicts a comparative method in which no pulses of plasma-reactive gas are provided.

FIG. 2 depicts a method according to the present invention in which one pulse of plasma-reactive gas is provided.

FIG. 3 depicts a comparative method in which no pulses of plasma-reactive gas are provided.

FIG. 4 depicts a method according to the present invention in which one pulse of plasma-reactive gas is provided.

FIG. 5 depicts both a method according to the present invention (dotted line) in which multiple pulses of plasma-reactive gas are provided and a comparative method (solid line) in which no pulses of plasma-reactive gas are provided.

DETAILED DESCRIPTION

Figure 1:
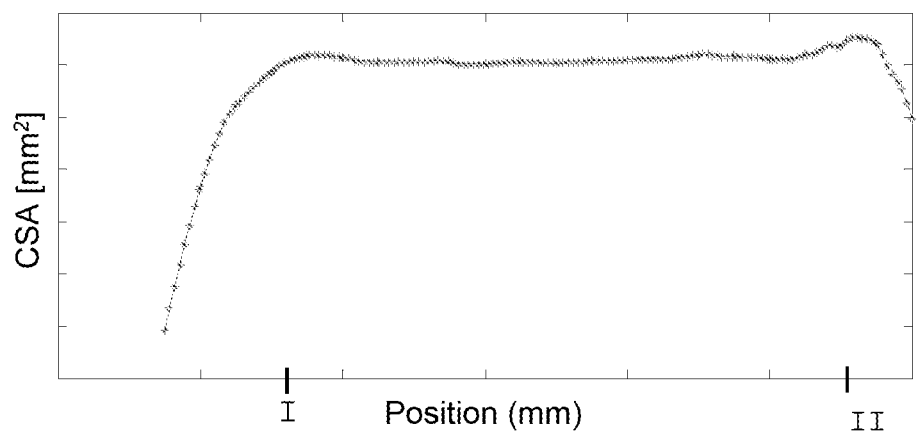
FIG. 1 depicts the cross-sectional area (CSA) for the core of the solid rod versus longitudinal position on a substrate tube with respect to the supply side of the substrate tube.

The present PCVD process includes the following steps: (i) providing a glass substrate tube having a supply side and a discharge side; (ii) supplying one or more glass-forming gases (e.g., doped or undoped) to the substrate tube, typically via a valve system/injection system at the substrate tube's supply side; and (iii) inducing a plasma within at least a portion of the substrate tube to effect deposition of one or more doped or undoped glass layers onto the substrate tube's interior surface. The plasma, which is typically induced by a microwave applicator that moves along the substrate tube in a forth-and-back movement, converts the glass-forming gases to a solid state to form glass layers. Moreover, during the step of inducing a plasma to effect deposition of one or more glass layers, plasma-reactive gas is supplied to the substrate tube in one or more pulses as a function of the plasma's axial position along the substrate tube's length to control deposition oscillation and/or refractive-index oscillation (e.g., alpha oscillation).

During a PCVD process, the present inventors have observed a non-uniform distribution of the microwave energy, which appears to be caused, inter alia, by dispersion or scattering of microwave power. Without being bound to any theory, the present inventors presume that part of the microwave power moves on the boundary between the plasma and the substrate tube. A standing wave, which may form within the substrate tube, can move beyond the generated plasma. The microwaves may be scattered beyond the plasma's frontline and may be reflected by conductive surfaces (e.g., the inner wall of the surrounding furnace) and by semi-conductive surfaces. More generally, microwaves are reflected at the point of materials transition (e.g., air-water, metal-plastic, air-ceramics, etc.). Thus, it is thought that the resulting distribution of the microwaves relative to the applicator depends on the applicator's position, causing so-called non-uniform microwave powers that may result in non-uniform temperatures and even multiple plasmas. The latter occurs when the amount of microwave leakage is such that increased microwave concentrations are present at different positions in the substrate tube, thereby producing plasma(s) outside of the applicator. This is possible because the furnace encloses not only the substrate tube within the applicator but also a large part of the remaining substrate tube. As such, a substantial portion of the substrate tube is heated to a high temperature (e.g., 900-1300° C.).

Previously, in European Patent No. 1,923,360 and its counterpart U.S. Pat. No. 7,981,485, the present inventors disclosed that by making both the applicator and the furnace reciprocally movable with respect to the longitudinal axis of the substrate tube, the non-uniform microwave distribution during the PCVD process is weakened. The present inventors, however, have more recently discovered that an additional phenomenon occurs when the applicator approaches the substrate tube's discharge side.

The induced plasma occupies a certain space that is dependent on the applicator's power. The width of the plasma is determined by the interior space within the substrate tube. With increasing number of passes and thus decreasing open diameter of the substrate tube, the plasma's length will increase if the power of the applicator stays the same (i.e., the plasma's volume will remain the same).

The present inventors have found that, at a certain point in the PCVD process, the hollow substrate tube's internal space will be so reduced that during the applicator's reciprocating movement, the plasma will extend outside of the furnace that surrounds the substrate tube, especially when the applicator is approaching the substrate tube's discharge side. The "tail" of the plasma in the direction of the gas flow (i.e., the discharge-side "tail" in the direction of the pump) will become so large that it extends outside of the furnace. The present inventors have observed a pumping or oscillating movement of the plasma in which the "tail" of the plasma is alternatively visible to a larger extent and to a smaller extent. In other words, it is visibly apparent that the plasma repeatedly moves a bit forward and a bit back.

The plasma thus has a dual, pulsating movement. The plasma primarily moves linearly with the movement of the applicator along the substrate tube's length. The plasma, however, can show—generally only in a part of the substrate tube—an oscillating, forward-backward movement due to scattering of microwave energy. This additional movement is generally visible only during part of the process, namely near the substrate tube's discharge side. Moreover, it might be the case that during the first several passes or strokes this oscillating behavior of the plasma is not readily visible or perhaps not even present. If the internal space within the substrate tube is sufficiently large, the plasma will have sufficient room. As the power of the generator or applicator stays the same and the free space inside of the substrate tube decreases (i.e., the substrate tube's open diameter decreases with increasing number of passes), this phenomenon of oscillating plasma will occur.

Glass deposition on the substrate tube's inner surface occurs only where the plasma is present. As noted, the glass forming gases may be doped or may be undoped. If the plasma's frontline position varies in a discontinuous way (i.e., by pulsating or oscillating), the glass deposition will exhibit a similar behavior, namely "deposition oscillation." In one pass, there will not be a completely smooth, thin deposition layer formed within the substrate tube. On the position of the substrate tube where the cumulative duration of plasma presence is higher, a larger or thicker layer of glass is formed. As noted, this effect is self-reinforcing. In subsequent pass the "thick spots" will generate more heat due to the poor heat conductivity of glass, leading to even more glass deposition in the next layers. This increases the effect of the deposition oscillation.

Figure 3:
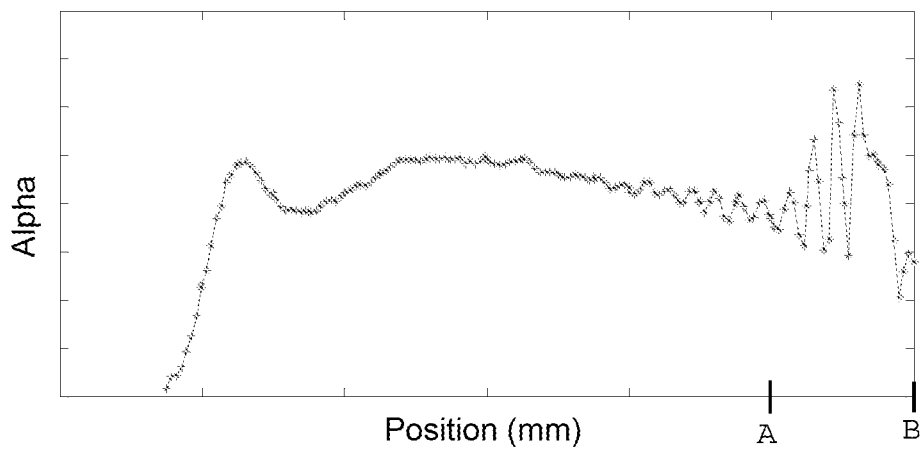
FIG. 3 depicts alpha value (no unit) versus longitudinal position on a substrate tube with respect to the supply side of the substrate tube.

FIG. 3 shows excessive variation in the alpha value, which describes the shape of the refractive index profile. Deposition oscillation as previously described will also typically lead to variation or oscillation in the alpha value (e.g., refractive-index oscillation). This is illustrated on the right side of the plot of FIG. 3.

For optical fibers, the refractive index profile is generally classified according to the graphical appearance of the function that associates the refractive index with the radius of the optical fiber. Conventionally, the distance r to the center of the optical fiber is shown on the x-axis, and the difference between the refractive index (at radius r) and the refractive index of the optical fiber's outer cladding (e.g., an outer optical cladding) is shown on the y-axis. The refractive index profile is referred to as a "step" profile, a "trapezoidal" profile, a "parabolic" profile, or a "triangular" profile for graphs having the respective shapes of a step, a trapezoid, a parabola, or a triangle. In this regard, an "alpha" profile typically has a gradient shape. These curves are generally representative of the optical fiber's theoretical or set profile. Constraints in the manufacture of the optical fiber, however, may result in a slightly different actual profile.

In a multimode optical fiber, the difference between the propagation times, or group delay times, of the several modes along the optical fiber determine the bandwidth of the optical fiber. In particular, for the same propagation medium (i.e., in a step-index multimode optical fiber), the different modes have different group delay times. This difference in group delay times results in a time lag between the pulses propagating along different radial offsets of the optical fiber.

To reduce intermodal dispersion, the multimode optical fibers used in telecommunications generally have a core with a refractive index that decreases progressively from the center of the optical fiber to its interface with a cladding (i.e., an "alpha" core profile). Such an optical fiber has been used for a number of years, and its characteristics have been described in "*Multimode Theory of Graded-Core Fibers*" by D. Gloge et al., Bell system Technical Journal 1973, pp. 1563-1578, and summarized in "*Comprehensive Theory of Dispersion in Graded-Index Optical Fibers*" by G. Yabre, Journal of Lightwave Technology, February 2000, Vol. 18, No. 2, pp. 166-177. Each of the above-referenced articles is hereby incorporated by reference in its entirety.

A graded-index profile (i.e., an alpha-index profile) can be described by a relationship between the refractive index value n and the distance r from the center of the optical fiber according to the following equation:

$$n = n_1 \sqrt{1 - 2\Delta \left(\frac{r}{a}\right)^\alpha}$$

wherein,

α≥1, and α is a non-dimensional parameter that is indicative of the shape of the index profile (α→∞ corresponds to a step index profile);

$n_1$ is the maximum refractive index of the optical fiber's core;

a is the radius of the optical fiber's core; and $$\Delta = \frac{(n_1^2 - n_0^2)}{2n_1^2}$$

where $n_0$ is the minimum refractive index of the multimode core, which may correspond to the refractive index of the outer cladding (most often made of silica).

A multimode optical fiber with a graded index (i.e., an alpha profile) therefore has a core profile with a rotational symmetry such that along any radial direction of the optical fiber the value of the refractive index decreases continuously from the center of the optical fiber's core to its periphery. When a multimode light signal propagates in such a graded-index core, the different optical modes experience differing propagation mediums (i.e., because of the varying refractive indices). This, in turn, affects the propagation speed of each optical mode differently. Thus, by adjusting the value of the parameter α, it is possible to obtain a group delay time that is nearly equal for all of the modes. Stated differently, the refractive index profile can be modified to reduce or even eliminate intermodal dispersion.

By way of example, if the alpha value is one (i.e., α=1), a triangular core profile is obtained. With graded-index optical fibers, it is desired that the alpha value be substantially constant over the length of the substrate tube.

As noted, FIG. 3 shows a variation in the alpha value. In particular, FIG. 3 shows large oscillations between longitudinal positions A and B near the substrate tube's discharge side. One objective of the present PCVD method is to reduce such alpha-value oscillations.

FIG. 1 depicts the so-called cross-sectional surface area (CSA), calculated on the basis of the thickness of the vapor-deposited layers. The aforesaid cross-sectional area (CSA) can be calculated as follows:

$$csa = \frac{\pi}{4}(d_u^2 - d_i^2)$$

wherein, $d_u$=external diameter layer x;

$d_i$=internal diameter layer; and

CSA=cross-sectional surface area layer x

FIG. 1 shows the CSA of the core measured after the PCVD process and the subsequent collapsing have been completed. FIG. 1 shows substantially constant CSA between positions I and II.

The current commercial trend in manufacturing optical fiber preforms is toward larger, thicker preforms, so more passes or strokes are required. This leads to substrate tubes after deposition (but before collapsing) that have even smaller internal diameters. The problem of deposition oscillation and the related refractive-index oscillation (e.g., alpha-value oscillation), particularly near the substrate tube's discharge side, is becoming more and more of a concern.

From observing the oscillation phenomena, it is now known that the problem arises as the plasma length and the plasma frontal position are changing relative to the furnace's metal walls. This varying plasma front causes the deposition front to change its position relative to the applicator's position. This results in thickness variations and refractive-index variations as a function of longitudinal position along substrate tube's length.

The present inventors have now developed a new solution to this oscillation problem. The present inventors apply certain gas (i.e., plasma-reactive gas) as a function of the plasma's axial position along the substrate tube's length in order to counteract the plasma's frontline movement. In this regard, a plasma-reactive gas is supplied to a substrate tube in which glass-forming takes place. The plasma-reactive gas interacts with the plasma to reduce the size of the plasma, thereby changing the plasma's frontline position in order to minimize deposition oscillation and/or refractive-index oscillation. This can be accomplished, for example, by using the gas injection device that is already present in the PCVD apparatus (i.e., to inject glass-forming gases). This gas injection device can be altered by adding an additional gas line and an in-line fast valve that is connected to a controller (e.g., a microcontroller).

Without being bound by any theory, the present inventors strive to reduce the oscillating behavior of the plasma, typically at the moment the plasma extends outside of the furnace, by "pushing back" the plasma. This may be achieved by exposing the plasma to a plasma-reactive gas that affects the plasma. The plasma-reactive gas is supplied in one or more pulses, and the plasma-reactive gas is typically supplied into the substrate tube from its supply side. This plasma-reactive gas has the effect of reducing the size of the plasma and thus changing the plasma's frontline position.

The timing and duration of these gas pulse(s) may be determined before starting the PCVD process. In this regard, the present inventors use the data obtained from a similar process using a similar substrate tube and similar reaction conditions. During such a test process, data are obtained such as depicted in FIG. 1 and FIG. 3. Based on these representative figures, the longitudinal position, width, and height of the "thick spots" are determined. Based on these parameters, the inventors determine at which longitudinal positions of the applicator the pulses of plasma-reactive gas are required or between which longitudinal positions one pulse of plasma-reactive gas is required. Moreover, the inventors also determine the duration of the pulses and the flow rate of the plasma-reactive gas.

This present PCVD method has the effect of stabilizing the frontline of the plasma during a pass or stroke. In other words, the oscillation behavior of the plasma is reduced or even eliminated.

As noted, the pulses of plasma-reactive gas may be timed to occur at intervals, typically equaling one half or an uneven multiple of one half of the microwave-radiation wavelength (λ). For example, for microwaves having a wavelength of 12 centimeters, the intervals of pulses are typically provided every 6 centimeters or so. For example, for an applicator velocity of about 30 cm/sec, a pulse might occur about every 0.2 second.

Those having ordinary skill in the art will appreciate that the velocity of the injected plasma-reactive gas (e.g., about 10 m/sec) is usually significantly greater than the velocity of the applicator. Consequently, and as a practical matter, the timing of the plasma-reactive-gas injection might acceptably disregard the relatively slow movement of the applicator and yet still achieve plasma-reactive-gas pulses that correspond to particular longitudinal positions along the substrate tube's length. In addition, other sequences of pulses may be determined by those having ordinary skill in the art based on testing graphs similar to FIGS. 1 and 3.

In one embodiment, one single pulse of plasma-reactive gas is provided, typically for at least 100 milliseconds (e.g., 110 milliseconds), more typically for at least 250 milliseconds (e.g., 1000 milliseconds or longer). The timing or placement of the pulse may be selected to correspond to the longitudinal position of the deposition oscillation and/or refractive-index oscillation along the substrate tube's length.

As noted, the duration of the pulses can vary according to the amount of plasma-reactive gas needed. For example, the duration can be between about 1 millisecond and 1000 milliseconds (e.g., between about 25 and 750 milliseconds). Those having ordinary skill in the art can determine the duration of the pulse in accordance with the size of the opening (e.g., orifice) through which the gas flows, the flow speed or pressure of the gas, and the composition of the gas. When more pulses are applied, the duration is typically between about 1 millisecond and 100 milliseconds, more typically between about 25 and 75 milliseconds.

The pressure of the plasma-reactive gas, for example, can be between about 0.5 and 5 bar, typically between 1 and 2 bar (e.g., about 1.5 bar). The pressure of the gas can be determined by those having ordinary skill in the art, together with the size of the opening through which the gas flows, the flow rate of the gas, the duration of the pulse, and the composition of the gas.

By way of illustration, if the duration of the gas pulse is doubled, then the flow rate should be halved in order to obtain the same amount of plasma-reactive gas. If the concentration of the plasma-reactive gas is decreased due to dilution with a non-plasma-reactive gas, then the duration of the pulse, the size of the gas inlet, or the pressure or flow rate should be increased to deliver the same amount of plasma-reactive gas.

Suitable plasma-reactive gases include argon, helium, nitrogen, and especially oxygen. The influence of the gases depends on the gas composition and maximum flow. When, for example, a certain amount of oxygen is provided, the plasma will tend to shorten and decrease in size.

As noted, the plasma-reactive gases can be used either in pure form, in combination with each other, and/or in combination with non-plasma-reactive gases (i.e., in diluted form). According to the present invention, one exemplary non-plasma-reactive gas is Freon ($C_2F_6$). An exemplary diluted form of the plasma-reactive gas is about five mole percent Freon ($C_2F_6$) in oxygen ($O_2$).

In another embodiment of the PCVD method, an additional gas line is attached to the substrate tube's supply side. Using a valve (e.g., a so-called fast valve), this additional gas line for supplying plasma-reactive gas is coupled to the supply system of glass-forming gases. The valve for supplying the plasma-reactive gas can be connected to an orifice having a certain size. The size of the opening has a direct influence on the amount of gas that is guided through the orifice.

The valve can be coupled to a controller (e.g., a microcontroller) that measures the position of the applicator and controls the duration that the valve is opened, thereby controlling the positions at which a particular amount of plasma-reactive gas is introduced into the substrate tube (e.g., as a function of the plasma's axial position along the substrate tube's length).

The present invention thus helps to offset changes caused by plasma length or frontal position variations by injecting (short) bursts of certain plasma-reactive gases (e.g., oxygen, argon, or helium). The pulses or bursts of the plasma-reactive gases are injected as a function of the position of the applicator (e.g., a resonator) along the substrate tube's length. For example, by using a fast valve and microcontroller, gas bursts are injected in such a way that the plasma length and/or frontal position deviations (e.g., increases) are offset (e.g., decreased) as a function of applicator's position along the length of the substrate tube. The increased gas flows (total gas flows and oxygen concentration) of the gas bursts (e.g., with oxygen being the only plasma-reactive gas) are used to shorten the plasma length. In particular, the length (e.g., valve open time) and/or magnitude (e.g., oxygen flow rate) of the oxygen bursts can be varied as a function of the applicator's position along the substrate tube's length. This helps to offset the plasma's length and frontal position deviations (e.g., deposition oscillations) that can vary in length and/or magnitude along the substrate tube (e.g., between the middle of the substrate tube and the pump side of the substrate tube). Those having ordinary skill in the art will appreciate that the foregoing description is in the context of oxygen gas, but is fully applicable to other plasma-reactive gases.

The present invention does not require significant changes to the existing instrumental setups or apparatuses. Therefore, the solution provided by the present invention is easy and cost-effective to implement.

In one embodiment, the pulses of plasma-reactive gas are provided during a whole pass. It is also possible, however, to determine a different injection protocol in which the valve opens only in the vicinity of the reversal point (e.g., at the discharge side). For example, it is possible that the injection only occurs at positions near the discharge side, such as in the last 150 to 400 millimeters (e.g., 150-200 millimeters) of the substrate tube near the discharge side.

In another embodiment, the pulses or bursts are provided during every pass at the same positions. It is also possible to determine the position for each separate pass or stroke and to adjust the position between passes or strokes. This can be selected, for example, depending on the concentration of germanium or the internal diameter of the substrate tube. This ensures the same environment during the complete PCVD process so as to minimize possible perturbations of optical properties if the deposition conditions are changing from pass to pass.

It is also possible, however, to determine a different injection protocol in which the valve opens only during the last several passes of a PCVD process. In view of the present disclosure, and without undue experimentation, those having ordinary skill in the art can develop effective protocols within the scope of the present invention.

Figure 2:
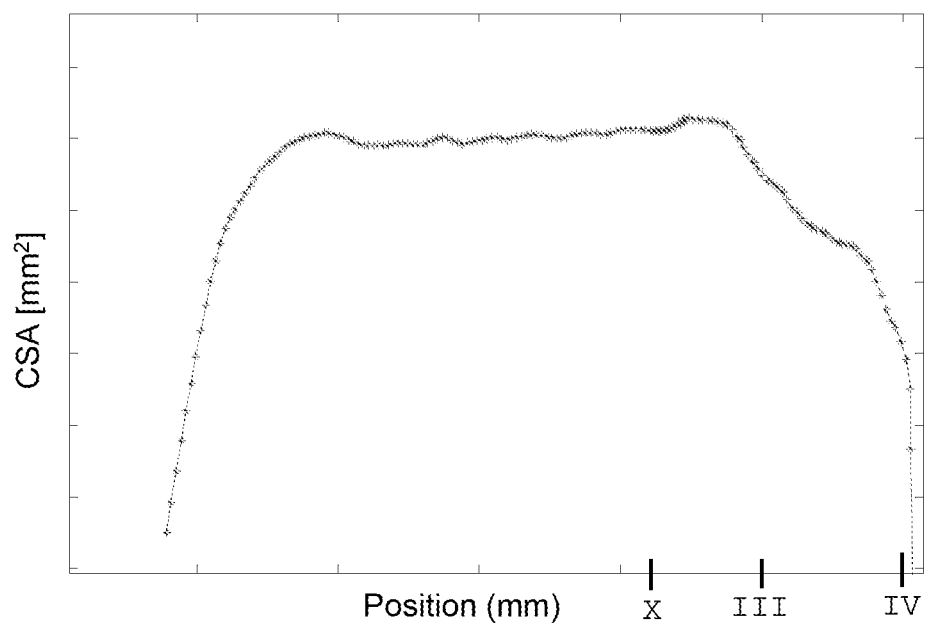
FIG. 2 depicts the cross-sectional area (CSA) versus longitudinal position on a substrate tube with respect to the supply side of the substrate tube.

Like FIG. 1, FIG. 2 depicts the cross-sectional area (CSA) versus longitudinal position on a substrate tube with respect to the substrate tube's supply side. Unlike FIG. 1, however, FIG. 2 is measured on a substrate tube prepared in accordance with the present invention as disclosed in Example 1 (below). FIG. 2 illustrates that the plasma-reactive gases have an effect of the plasma. In FIG. 2, between the longitudinal positions III and IV, the CSA value decreases. This is indicative of a decrease in the glass-forming yield compared to FIG. 1, where no plasma-reactive gas is added.

Figure 4:
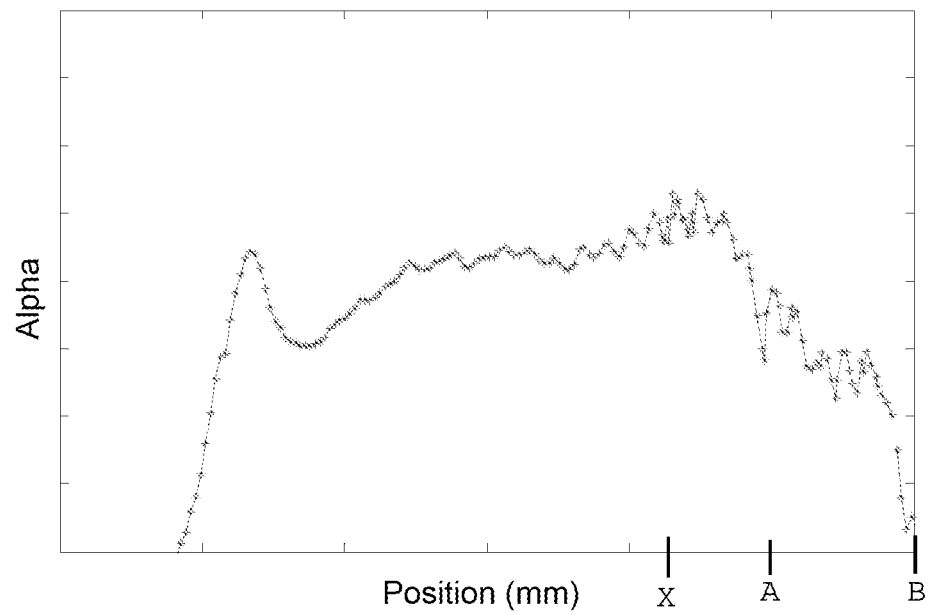
FIG. 4 depicts alpha value (no unit) versus longitudinal position on a substrate tube with respect to the supply side of the substrate tube.

Like FIG. 3, FIG. 4 depicts alpha value versus longitudinal position on a substrate tube with respect to the substrate tube's supply side. Unlike FIG. 3, however, FIG. 4 is measured on a substrate tube prepared in accordance with the present invention as disclosed in Example 1 (below). FIG. 4 illustrates a substantial reduction in the oscillating behavior in the alpha value in the region between A and B. Accordingly, the PCVD process according to the present method helps to reduce excessive alpha oscillations.

Figure 5:
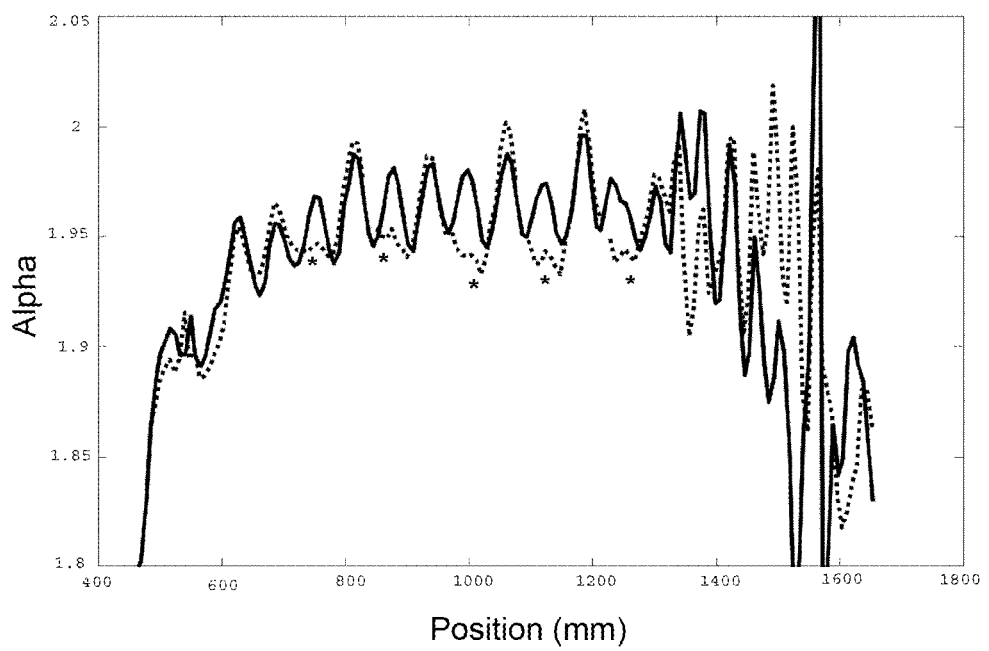
FIG. 5 depicts alpha value (no unit) versus longitudinal position on a substrate tube with respect to the supply side of the substrate tube.

FIG. 5 depicts alpha value (no unit) versus longitudinal position on a substrate tube with respect to the substrate tube's supply side. FIG. 5 depicts both a method according to Example 2 (dotted line) in which multiple pulses of plasma-reactive gas are provided and a comparative method according to Comparative Example 1 (solid line) in which no pulses of plasma-reactive gas are provided. FIG. 5 shows, for the comparative example, a large oscillation in alpha value between 660 millimeters and 1240 millimeters.

On the other hand, the dotted line in FIG. 5 shows measurements of alpha value carried out according to the present invention. The alpha oscillations are significantly reduced between 660 millimeters and 1240 millimeters, particularly at the positions where a pulse is applied (i.e., as indicated by the asterisks at 1240 millimeters, 1140 millimeters, 1020 millimeters, 900 millimeters, and 780 millimeters). FIG. 5 thus demonstrates that the present PCVD method significantly reduces localized oscillations in alpha value.

As noted, those having ordinary skill in the art can determine the injection protocol based on a test PCVD process in order to prepare plots similar to those of FIG. 1 and FIG. 3. Since the phenomenon that occurs is a physical phenomenon, it will repeatedly occur at essentially the same positions, provided the wavelength of the microwaves is not changed. Moreover, this new PCVD process is completely reproducible irrespective of the width of the original substrate tube used and irrespective of the number of passes employed.

By way of example, deposition of glass layers may continue until the internal diameter of the remaining substrate tube is less than about 22 millimeters, such as 20 millimeters or less (e.g., about 15 millimeters).

The refractive index value and the alpha value of the substrate tube thus obtained after internal deposition is substantially uniform along the substrate tube's length.

In an exemplary embodiment, the substrate tube is fixed or clamped in position in the apparatus on both ends thereof and the applicator (and optionally also the furnace) is movable along the substrate tube's longitudinal axis. This configuration is particularly advantageous, because existing PCVD equipment can be readily adapted. It is also possible to rotate the substrate tube during the deposition process or to externally flush the substrate tube with an inert gas so as to prevent deposition of furnace particles on the substrate tube's outer surface.

Typically, the distance over which the applicator is movable between a point of reversal located at the substrate tube's supply side and a point of reversal located at the substrate tube's discharge side is selected so that the furnace will surround the applicator at all times. Moving the furnace may take place continuously, discontinuously, or in steps. In other words, the applicator will be moved in such a manner during the deposition process that the furnace, which is likewise movable, will surround the applicator at all times. In other words, the applicator cannot move outside the furnace (i.e., the movable applicator will at all times be positioned within the movable furnace). The deposition of glass layers occurs along the distance over which the applicator is moved. The substrate tube has a length greater than the sum of the length of the furnace and the "stroke" of the movable furnace, because both ends of the substrate tube are fixed in clamps, which cannot withstand the furnace's high temperature.

Typically, the applicator is cylindrically symmetrical and annular in shape. The applicator may include an annular resonator space that extends cylindrically and symmetrically around the cylindrical axis. The annular resonator space includes a slit that extends in a full circle around its cylindrical axis. Microwave energy from the microwave guide is transmitted through this slit into the resonator space.

To realize an optimal transfer of the microwave energy, the waveguide typically has a longitudinal axis that extends substantially perpendicularly to the cylindrical axis. The waveguide's longitudinal axis does not intersect the slit or the passage. More particularly, the waveguide's longitudinal axis does not divide the resonator space into two equal halves.

The applicator and the furnace may move in the same direction or in opposite directions along the length of the substrate tube.

In a specific embodiment, the furnace moves in a stepwise movement along the length of the substrate tube. This stepwise movement may be understood to include moving the furnace to a particular location (e.g., at the discharge side of the substrate tube), maintaining this position for some time, and subsequently returning the furnace to the original or other location (e.g., the supply side of the substrate tube). This latter position is typically maintained for some time as well, whereupon the furnace is again moved to the location at the substrate tube's discharge side.

It is also possible to have the furnace move in steps (e.g., from the substrate tube's supply side toward the substrate tube's discharge side) in which the furnace will be stationary for some time at specific positions along the length of the substrate tube. A velocity profile of the furnace would show reciprocal, stepwise movement along the length of the substrate tube in steps. Such cycles may be repeated during the entire deposition process or during part of the deposition process.

Typical cycle times for the movement of the furnace may be between 1 second and 600 seconds. A furnace cycle of greater than about 600 seconds can lead to disturbances in the profile, whereas furnace cycle of less than 1 second may fail to achieve the intended uniformity of the CSA and the refractive-index profile. Moreover, a furnace cycle of less than 1 second may lead to mechanical problems.

In process embodiments that use a furnace and applicator moving along the length of the substrate tube, the ratio between the cycle time of the furnace and the cycle time of the applicator typically does not equal an integer. As will be understood by those having ordinary skill in the art, the ratio can be readily calculated by dividing the longest cycle time by the shortest cycle time.

The movement of the furnace over the substrate tube typically equals an uneven multiple of a quarter wavelength of the microwaves being used (e.g., about $\frac{1}{4}n\cdot\lambda$, where n is an uneven number). In practice, suitable microwaves have a frequency of about 2.45 GHz, 890 MHz, or 5.8 GHz. In practice, furnace-movement distances of 30 millimeters, 90 millimeters, 150 millimeters and the like are particularly used. The term "movement" refers to the distance over which the furnace is moved longitudinally over the substrate tube.

According to another embodiment of the present method, the furnace is continuously moved between the two locations at the substrate tube's supply side and the substrate tube's discharge side. Here, the distance over which the furnace is moved is an uneven multiple of a quarter of the wavelength of the microwaves being used (e.g., about $\frac{1}{4}\lambda$). Moreover, when comparing the cycle time of the furnace to the cycle time of the applicator, the ratio of the longest cycle time to the shortest cycle time does not equal an integer. For practical reasons, the furnace velocity is typically less than 5 cm/sec (e.g., 1 cm/sec or less).

Although a moving furnace has been described so far, it is also possible in a specific embodiment to provide the furnace internally with parts or elements that move along the length of the substrate tube. In such an embodiment, the furnace itself is stationary, but some of its parts or elements (e.g., metal parts arranged concentrically around the substrate tube) are being moved to prevent a disturbance of the microwave energy along the substrate tube's length during the deposition process.

According to another embodiment of the present invention, the substrate tube, including the typical connections, is movable with respect to the stationary furnace and applicator.

The term "movable along the longitudinal axis" as used herein is to be understood as a movement along the length of the substrate tube. This movement can take place not only parallel to the substrate tube (i.e., with respect to the substrate tube's longitudinal direction) but also at one or more angles (e.g., from the upper side to the bottom side or from the front side to the rear side).

After the glass layers have been deposited onto the interior surface of the glass substrate tube, the glass substrate tube is subsequently contracted into a solid rod by heating ("collapsing"). In another embodiment, the solid rod may furthermore be externally provided with an additional amount of glass (e.g., via an external vapor deposition process or by using one or more preformed glass tubes) to thus obtain a composite preform. As is known by those having ordinary skill in the art, an end of the resulting preform is heated and drawn in a drawing tower to achieve optical fibers.

The present invention may be further explained with reference to the following non-limiting examples:

COMPARATIVE EXAMPLE 1

A PCVD process was carried out in a PCVD apparatus using a stationary substrate tube, a furnace moving reciprocally over the substrate tube, and an applicator moving reciprocally over the substrate tube. During the PCVD process, glass-forming precursors were supplied to the interior of the substrate tube.

The effective length of the furnace (i.e., the internal length without the thickness of the furnace walls) was approximately 1.7 meters. The length of the substrate tube was approximately 2 meters. The external diameter of the substrate tube was 39 millimeters, and the internal diameter of the substrate tube was 34 millimeters. The length of an applicator was approximately 0.2 meter. Under the prevailing conditions within the substrate tube's interior, concentric glass layers were deposited using a typical applicator velocity of 33 centimeters per second.

After the completion of the deposition process, the resulting substrate tube was subjected to a contraction process in order to obtain a solid rod (i.e., a primary preform).

FIG. 1 depicts cross-sectional area (CSA), and FIG. 3 depicts alpha value for the solid rod's core as a function of length (i.e., longitudinal position). FIGS. 1 and 3 illustrates the non-uniformity over the solid rod's length, which adversely affects the quality of the resulting, drawn optical fiber (e.g., with respect to attenuation, mode-field-diameter uniformity, and bandwidth uniformity, etc.).

EXAMPLE 1

Another PCVD process was carried out in a PCVD apparatus described in Comparative Example 1 (above), except that one 750-millisecond pulse of oxygen was provided to correspond to an longitudinal position of 1240 millimeters along the substrate tube (referenced by X in FIGS. 2 and 4). The orifice through which the oxygen flowed had an orifice No. 28 (Kv parameter value of 0.011 $m^3n$/hour). The gas pressure was 1.5 bar. The resulting substrate tube was subjected to a contraction process so as to obtain a solid rod (i.e., a primary preform) in the same manner as Comparative Example 1.

FIG. 2 depicts cross-sectional area (CSA), and FIG. 4 depicts alpha value for the solid rod's core as a function of length (i.e., longitudinal position). FIGS. 2 and 4 illustrate effects of the present invention. For instance, FIG. 4 shows substantially reduced alpha-value variation over length of the glass rod as compared to the extreme alpha oscillations shown in FIG. 3 (i.e., between positions A and B). In this way, the present invention reduces the adverse effects of Comparative Example 1.

EXAMPLE 2

Another PCVD process was carried out in a PCVD apparatus described in Comparative Example 1 (above), except that five 50-millisecond pulses of 5 percent Freon and 95 percent oxygen were provided to correspond to longitudinal positions of 1240 millimeters and repeated at 1140 millimeters, 1020 millimeters, 900 millimeters, 780 millimeters, and 660 millimeters, respectively, along the substrate tube. These longitudinal positions are referenced by asterisks (*) in FIG. 5.

The orifice through which the plasma-reactive gas flowed had an orifice No. 28 (Kv parameter value of 0.011 $m^3n$/hour). The gas pressure was 1.8 bar. The resulting substrate tube was subjected to a contraction process so as to obtain a solid rod (i.e., a primary preform) in the same manner as Comparative Example 1.

To supplement the present disclosure, this application incorporates entirely by reference the following commonly assigned patents, patent application publications, and patent applications: U.S. Pat. No. 4,838,643 for a Single Mode Bend Insensitive Fiber for Use in Fiber Optic Guidance Applications (Hodges et al.); U.S. Pat. No. 7,623,747 for a Single Mode Optical Fiber (de Montmorillon et al.); U.S. Pat. No. 7,587,111 for a Single-Mode Optical Fiber (de Montmorillon et al.); U.S. Pat. No. 7,356,234 for a Chromatic Dispersion Compensating Fiber (de Montmorillon et al.); U.S. Pat. No. 7,483,613 for a Chromatic Dispersion Compensating Fiber (Bigot-Astruc et al.); U.S. Pat. No. 7,526,177 for a Fluorine-Doped Optical Fiber (Matthijsse et al.); U.S. Pat. No. 7,555,186 for an Optical Fiber (Flammer et al.); U.S. Pat. No. 8,055,111 for a Dispersion-Shifted Optical Fiber (Sillard et al.); U.S. Pat. No. 8,041,172 for a Transmission Optical Fiber Having Large Effective Area (Sillard et al.); International Patent Application Publication No. WO 2009/062131 A1 for a Microbend-Resistant Optical Fiber (Overton); U.S. Pat. No. 8,265,442 for a Microbend-Resistant Optical Fiber (Overton); U.S. Pat. No. 8,145,025 for a Single-Mode Optical Fiber Having Reduced Bending Losses (de Montmorillon et al.); U.S. Pat. No. 7,889,960 for a Bend-Insensitive Single-Mode Optical Fiber (de Montmorillon et al.); U.S. Patent Application Publication No. US2010/0021170 A1 for a Wavelength Multiplexed Optical System with Multimode Optical Fibers (Lumineau et al.); U.S. Pat. No. 7,995,888 for a Multimode Optical Fibers (Gholami et al.); U.S. Patent Application Publication No. US2010/0119202 A1 for a Reduced-Diameter Optical Fiber (Overton); U.S. Patent Application Publication No. US2010/0142969 A1 for a Multimode Optical System (Gholami et al.); U.S. Pat. No. 8,259,389 for an Amplifying Optical Fiber and Method of Manufacturing (Pastouret et al.); U.S. Patent Application Publication No. US2010/0135627 A1 for an Amplifying Optical Fiber and Production Method (Pastouret et al.); U.S. Patent Application Publication No. US2010/0142033 for an Ionizing Radiation-Resistant Optical Fiber Amplifier (Regnier et al.); U.S. Pat. No. 8,274,647 for a Method of Classifying a Graded-Index Multimode Optical Fiber (Gholami et al.); U.S. Patent Application Publication No. US2010/0189397 A1 for a Single-Mode Optical Fiber (Richard et al.); U.S. Pat. No. 8,290,324 for a Single-Mode Optical Fiber Having an Enlarged Effective Area (Sillard et al.); U.S. Pat. No. 8,301,000 for a Single-Mode Optical Fiber (Sillard et al.); U.S. Patent Application Publication No. US2010/0214649 A1 for an Optical Fiber Amplifier Having Nanostructures (Burow et al.); U.S. Pat. No. 8,009,950 for a Multimode Fiber (Molin et al.); U.S. Patent Application Publication No. US2010/0310218 A1 for a Large Bandwidth Multimode Optical Fiber Having a Reduced Cladding Effect (Molin et al.); U.S. Patent Application Publication No. US2011/0058781 A1 for a Multimode Optical Fiber Having Improved Bending Losses (Molin et al.); U.S. Patent Application Publication No. US2011/0064367 A1 for a Multimode Optical Fiber (Molin et al.); U.S. Patent Application Publication No. US2011/0069724 A1 for an Optical Fiber for Sum-Frequency Generation (Richard et al.); U.S. Patent Application Publication No. US2011/0116160 A1 for a Rare-Earth-Doped Optical Fiber Having Small Numerical Aperture (Boivin et al.); U.S. Pat. No. 8,280,213 for a High-Bandwidth, Multimode Optical Fiber with Reduced Cladding Effect (Molin et al.); U.S. Patent Application Publication No. US2011/0123162 A1 for a High-Bandwidth, Dual-Trench-Assisted Multimode Optical Fiber (Molin et al.); U.S. Patent Application Publication No. US2011/0135262 A1 for a Multimode Optical Fiber with Low Bending Losses and Reduced Cladding Effect (Molin et al.); U.S. Patent Application Publication No. US2011/0135263 A1 for a High-Bandwidth Multimode Optical Fiber Having Reduced Bending Losses (Molin et al.); U.S. Patent Application Publication No. US2011/0188826 A1 for a Non-Zero Dispersion Shifted Optical Fiber Having a Large Effective Area (Sillard et al.); U.S. Patent Application Publication No. US2011/0188823 A1 for a Non-Zero Dispersion Shifted Optical Fiber Having a Short Cutoff Wavelength (Sillard et al.); U.S. Patent Application Publication No. 2011/0217012 A1 for a Broad-Bandwidth Multimode Optical Fiber Having Reduced Bending Losses (Bigot-Astruc et al.); U.S. Patent Application Publication No. 2011/0229101 A1 for a Single-Mode Optical Fiber (de Montmorillon et al.); U.S. Patent Application Publication No. 2012/0051703 A1 for a Single-Mode Optical Fiber (Bigot-Astruc et al.); U.S. Patent Application Publication No. 2012/0040184 A1 for a Method of Fabricating an Optical Fiber Preform (de Montmorillon et al.); U.S. Patent Application Publication No. 2012/0092651 A1 for a Multimode Optical Fiber Insensitive to Bending Losses (Molin et al.); U.S. Patent Application Publication No. 2012/0134376 A1 for a Radiation-Insensitive Optical Fiber Doped with Rare Earths (Burow et al.); U.S. Patent Application Publication No. 2012/0148206 A1 for a Rare-Earth-Doped Optical Fiber (Boivin et al.); U.S. Patent Application Publication No. 2012/0195549 A1 for a Broad-Bandwidth Optical Fiber (Molin et al.); U.S. Patent Application Publication No. 2012/0195561 A1 for a Multimode Optical Fiber (Molin et al.); U.S. Patent Application Publication No. 2012/00224254 A1 for a Rare-Earth-Doped Amplifying Optical Fiber (Burow et al.); U.S. Patent Application Publication No. 2012/0243843 A1 for a Bend-Resistant Multimode Optical Fiber, (Molin et al.); U.S. Patent Application Publication No. 2012/0251062 A1 for a Multimode Optical Fiber, (Molin et al.); U.S. patent application Ser. No. 13/456,562 for a High-Bandwidth, Radiation-Resistant Multimode Optical Fiber, filed Apr. 26, 2012, (Krabshuis et al.); U.S. patent application Ser. No. 13/481,150 for a Single-Mode Optical Fiber, filed May 25, 2012, (Sillard et al.); U.S. patent application Ser. No. 13/491,953 for a Single-Mode Optical Fiber, filed Jun. 8, 2012, (Sillard et al.) U.S. patent application Ser. No. 13/534,793 for a Multimode Optical Fiber, filed Jun. 27, 2012, (Bigot-Astruc et al.); and U.S. patent application Ser. No. 13/627,351 for a Trench-Assisted Multimode Optical Fiber, filed Sep. 26, 2012, (Molin).

To supplement the present disclosure, this application further incorporates entirely by reference the following commonly assigned patents, patent application publications, and patent applications: U.S. Pat. No. 5,574,816 for Polypropylene-Polyethylene Copolymer Buffer Tubes for Optical Fiber Cables and Method for Making the Same; U.S. Pat. No. 5,717,805 for Stress Concentrations in an Optical Fiber Ribbon to Facilitate Separation of Ribbon Matrix Material; U.S. Pat. No. 5,761,362 for Polypropylene-Polyethylene Copolymer Buffer Tubes for Optical Fiber Cables and Method for Making the Same; U.S. Pat. No. 5,911,023 for Polyolefin Materials Suitable for Optical Fiber Cable Components; U.S. Pat. No. 5,982,968 for Stress Concentrations in an Optical Fiber Ribbon to Facilitate Separation of Ribbon Matrix Material; U.S. Pat. No. 6,035,087 for an Optical Unit for Fiber Optic Cables; U.S. Pat. No. 6,066,397 for Polypropylene Filler Rods for Optical Fiber Communications Cables; U.S. Pat. No. 6,175,677 for an Optical Fiber Multi-Ribbon and Method for Making the Same; U.S. Pat. No. 6,085,009 for Water Blocking Gels Compatible with Polyolefin Optical Fiber Cable Buffer Tubes and Cables Made Therewith; U.S. Pat. No. 6,215,931 for Flexible Thermoplastic Polyolefin Elastomers for Buffering Transmission Elements in a Telecommunications Cable; U.S. Pat. No. 6,134,363 for a Method for Accessing Optical Fibers in the Midspan Region of an Optical Fiber Cable; U.S. Pat. No. 6,381,390 for a Color-Coded Optical Fiber Ribbon and Die for Making the Same; U.S. Pat. No. 6,181,857 for a Method for Accessing Optical Fibers Contained in a Sheath; U.S. Pat. No. 6,314,224 for a Thick-Walled Cable Jacket with Non-Circular Cavity Cross Section; U.S. Pat. No. 6,334,016 for an Optical Fiber Ribbon Matrix Material Having Optimal Handling Characteristics; U.S. Pat. No. 6,321,012 for an Optical Fiber Having Water Swellable Material for Identifying Grouping of Fiber Groups; U.S. Pat. No. 6,321,014 for a Method for Manufacturing Optical Fiber Ribbon; U.S. Pat. No. 6,210,802 for Polypropylene Filler Rods for Optical Fiber Communications Cables; U.S. Pat. No. 6,493,491 for an Optical Drop Cable for Aerial Installation; U.S. Pat. No. 7,346,244 for a Coated Central Strength Member for Fiber Optic Cables with Reduced Shrinkage; U.S. Pat. No. 6,658,184 for a Protective Skin for Optical Fibers; U.S. Pat. No. 6,603,908 for a Buffer Tube that Results in Easy Access to and Low Attenuation of Fibers Disposed Within Buffer Tube; U.S. Pat. No. 7,045,010 for an Applicator for High-Speed Gel Buffering of Flextube Optical Fiber Bundles; U.S. Pat. No. 6,749,446 for an Optical Fiber Cable with Cushion Members Protecting Optical Fiber Ribbon Stack; U.S. Pat. No. 6,922,515 for a Method and Apparatus to Reduce Variation of Excess Fiber Length in Buffer Tubes of Fiber Optic Cables; U.S. Pat. No. 6,618,538 for a Method and Apparatus to Reduce Variation of Excess Fiber Length in Buffer Tubes of Fiber Optic Cables; U.S. Pat. No. 7,322,122 for a Method and Apparatus for Curing a Fiber Having at Least Two Fiber Coating Curing Stages; U.S. Pat. No. 6,912,347 for an Optimized Fiber Optic Cable Suitable for Microduct Blown Installation; U.S. Pat. No. 6,941,049 for a Fiber Optic Cable Having No Rigid Strength Members and a Reduced Coefficient of Thermal Expansion; U.S. Pat. No. 7,162,128 for Use of Buffer Tube Coupling Coil to Prevent Fiber Retraction; U.S. Pat. No. 7,515,795 for a Water-Swellable Tape, Adhesive-Backed for Coupling When Used Inside a Buffer Tube (Overton et al.); U.S. Patent Application Publication No. 2008/0292262 for a Grease-Free Buffer Optical Fiber Buffer Tube Construction Utilizing a Water-Swellable, Texturized Yarn (Overton et al.); European Patent Application Publication No. 1,921,478 A1, for a Telecommunication Optical Fiber Cable (Tatat et al.); U.S. Pat. No. 7,702,204 for a Method for Manufacturing an Optical Fiber Preform (Gonnet et al.); U.S. Pat. No. 7,570,852 for an Optical Fiber Cable Suited for Blown Installation or Pushing Installation in Microducts of Small Diameter (Nothofer et al.); U.S. Pat. No. 7,646,954 for an Optical Fiber Telecommunications Cable (Tatat); U.S. Pat. No. 7,599,589 for a Gel-Free Buffer Tube with Adhesively Coupled Optical Element (Overton et al.); U.S. Pat. No. 7,567,739 for a Fiber Optic Cable Having a Water-Swellable Element (Overton); U.S. Pat. No. 7,817,891 for a Method for Accessing Optical Fibers within a Telecommunication Cable (Lavenne et al.); U.S. Pat. No. 7,639,915 for an Optical Fiber Cable Having a Deformable Coupling Element (Parris et al.); U.S. Pat. No. 7,646,952 for an Optical Fiber Cable Having Raised Coupling Supports (Parris); U.S. Pat. No. 7,724,998 for a Coupling Composition for Optical Fiber Cables (Parris et al.); U.S. Patent Application Publication No. US2009/0214167 A1 for a Buffer Tube with Hollow Channels (Lookadoo et al.); U.S. Patent Application Publication No. US2009/0297107 A1 for an Optical Fiber Telecommunication Cable (Tatat); U.S. Pat. No. 8,195,018 for a Buffer Tube with Adhesively Coupled Optical Fibers and/or Water-Swellable Element; U.S. Patent Application Publication No. US2010/0092135 A1 for an Optical Fiber Cable Assembly (Barker et al.); U.S. Pat. No. 7,974,507 A1 for a High-Fiber-Density Optical Fiber Cable (Louie et al.); U.S. Pat. No. 7,970,247 for a Buffer Tubes for Mid-Span Storage (Barker); U.S. Pat. No. 8,081,853 for Single-Fiber Drop Cables for MDU Deployments (Overton); U.S. Pat. No. 8,041,167 for an Optical-Fiber Loose Tube Cables (Overton); U.S. Pat. No. 8,145,026 for a Reduced-Size Flat Drop Cable (Overton et al.); U.S. Pat. No. 8,165,439 for ADSS Cables with High-Performance Optical Fiber (Overton); U.S. Pat. No. 8,041,168 for Reduced-Diameter Ribbon Cables with High-Performance Optical Fiber (Overton); U.S. Pat. No. 8,031,997 for a Reduced-Diameter, Easy-Access Loose Tube Cable (Overton); U.S. Patent Application Publication No. US2010/0150505 A1 for a Buffered Optical Fiber (Testu et al.); U.S. Patent Application Publication No. US2010/0154479 A1 for a Method and Device for Manufacturing an Optical Preform (Milicevic et al.); U.S. Patent Application Publication No. US2010/0166375 for a Perforated Water-Blocking Element (Parris); U.S. Patent Application Publication No. US2010/0183821 A1 for a UVLED Apparatus for Curing Glass-Fiber Coatings (Hartsuiker et al.); U.S. Patent Application Publication No. US2010/0202741 A1 for a Central-Tube Cable with High-Conductivity Conductors Encapsulated with High-Dielectric-Strength Insulation (Ryan et al.); U.S. Patent Application Publication No. US2010/0215328 A1 for a Cable Having Lubricated, Extractable Elements (Tatat et al.); U.S. Patent Application Publication No. US2011/0026889 A1 for a Tight-Buffered Optical Fiber Unit Having Improved Accessibility (Risch et al.); U.S. Patent Application Publication No. US2011/0064371 A1 for Methods and Devices for Cable Insertion into Latched Conduit (Leatherman et al.); U.S. Patent Application Publication No. 2011/0069932 A1 for a High-Fiber-Density Optical-Fiber Cable (Overton et al.); U.S. Patent Application Publication No. 2011/0091171 A1 for an Optical-Fiber Cable Having High Fiber Count and High Fiber Density (Tatat et al.); U.S. Patent Application Publication No. 2011/0176782 A1 for a Water-Soluble Water-Blocking Element (Parris); U.S. Patent Application Publication No. 2011/0268400 A1 for a Data-Center Cable (Louie et al.); U.S. Patent Application Publication No. 2011/0268398 A1 for a Bundled Fiber Optic Cables (Quinn et al.); U.S. Patent Application Publication No. 2011/0287195 A1 for a Curing Apparatus Employing Angled UVLEDs (Molin); U.S. Patent Application Publication No. 2012/0009358 for a Curing Apparatus Having UV Sources That Emit Differing Ranges of UV Radiation (Gharbi et al.); U.S. Patent Application Publication No. 2012/0014652 A1 for a Adhesively Coupled Optical Fibers and Enclosing Tape (Parris); U.S. Patent Application Publication No. 2012/0040105 A1 for a Method and Apparatus Providing Increased UVLED Intensity (Overton); U.S. Patent Application Publication No. 2012/0057833 A1 for an Optical-Fiber Module Having Improved Accessibility (Tatat); and U.S. Patent Application Publication No. 2012/0213483 A1 for a Optical-Fiber Interconnect Cable (Risch et al.).

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A method of Plasma Chemical Vapor Deposition, comprising:
   supplying one or more glass-forming gases to a glass substrate tube;
   inducing, via microwave radiation at a wavelength $\lambda$, a plasma within the glass substrate tube to effect deposition of one or more glass layers onto the substrate tube's interior surface; and
   during the step of inducing a plasma to effect deposition of one or more glass layers, supplying plasma-reactive gas to the substrate tube in one or more pulses as a function of the plasma's axial position along the substrate tube's length to control deposition oscillation and/or refractive-index oscillation, wherein the one or more pulses correspond to longitudinal positions along the substrate tube's length equaling one half or an uneven multiple of one half of the microwave-radiation wavelength $\lambda$.

2. The PCVD method according to claim 1, wherein the step of supplying plasma-reactive gas to the substrate tube in one or more pulses as a function of the plasma's axial position along the substrate tube's length comprises supplying plasma-reactive gas to the substrate tube in multiple pulses, wherein the multiple pulses correspond to longitudinal positions along the substrate tube's length equaling one half or an uneven multiple of one half of the microwave-radiation wavelength $\lambda$.

3. The PCVD method according to claim 2, wherein microwave-radiation wavelength $\lambda$ is about twelve centimeters and the multiple pulses correspond to six-centimeter longitudinal intervals along the substrate tube's length.

4. The PCVD method according to claim 2, wherein duration of each multiple pulse of plasma-reactive gas is less than about 1000 milliseconds.

5. The PCVD method according to claim 2, wherein duration of each multiple pulse of plasma-reactive gas is between about 1 millisecond and 100 milliseconds.

6. The PCVD method according to claim 2, wherein the step of supplying plasma-reactive gas to the substrate tube in one or more pulses comprises supplying argon, helium, oxygen, and/or nitrogen.

7. The PCVD method according to claim 1, wherein the step of supplying plasma-reactive gas to the substrate tube in one or more pulses as a function of the plasma's axial position along the substrate tube's length comprises supplying plasma-reactive gas to the substrate tube in a single pulse to control deposition oscillation and/or refractive-index oscillation at a longitudinal position along the substrate tube's length.

8. The PCVD method according to claim 7, wherein duration of the single pulse of plasma-reactive gas is at least about 100 milliseconds.

9. The PCVD method according to claim 7, wherein duration of the single pulse of plasma-reactive gas is between about 250 milliseconds and 1000 milliseconds.

10. The PCVD method according to claim 7, wherein the step of supplying plasma-reactive gas to the substrate tube in one or more pulses comprises supplying argon, helium, oxygen, and/or nitrogen.

11. The PCVD method according to claim 1, wherein the step of supplying plasma-reactive gas to the substrate tube in one or more pulses comprises supplying plasma-reactive gas to the substrate tube at between about 0.5 bar and 5 bar.

12. The PCVD method according to claim 1, wherein the step of supplying plasma-reactive gas to the substrate tube in one or more pulses comprises supplying plasma-reactive gas to the substrate tube at between about 1 bar and 2 bar.

13. The PCVD method according to claim 1, wherein the step of supplying plasma-reactive gas to the substrate tube in one or more pulses comprises supplying plasma-reactive gas that is at least 50 mole percent argon, helium, oxygen, and/or nitrogen.

14. The PCVD method according to claim 1, wherein the step of supplying plasma-reactive gas to the substrate tube in one or more pulses comprises supplying plasma-reactive gas that is at least about 90 mole percent argon, helium, oxygen, and/or nitrogen.

15. The PCVD method according to claim 1, wherein the step of supplying plasma-reactive gas to the substrate tube in one or more pulses comprises (i) supplying plasma-reactive gas to the substrate tube as a function of the plasma's axial position and (ii) reacting the plasma-reactive gas with the plasma to reduce the plasma's size and to change the plasma's frontline position in order to reduce deposition oscillation and/or refractive-index oscillation at one or more longitudinal positions along the substrate tube's length.

* * * * *